(12) United States Patent
Sakaino

(10) Patent No.: US 9,257,815 B1
(45) Date of Patent: Feb. 9, 2016

(54) OPTICAL SEMICONDUCTOR DEVICE

(71) Applicant: Mitsubishi Electric Corporation, Tokyo (JP)

(72) Inventor: Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/691,750

(22) Filed: Apr. 21, 2015

(30) Foreign Application Priority Data

Jul. 28, 2014 (JP) ................. 2014-152780

(51) Int. Cl.
*H01S 5/343* (2006.01)
*H01S 5/227* (2006.01)
*H01S 5/34* (2006.01)
*H01S 5/125* (2006.01)
*H01S 5/10* (2006.01)

(52) U.S. Cl.
CPC . *H01S 5/343* (2013.01); *H01S 5/10* (2013.01); *H01S 5/125* (2013.01); *H01S 5/227* (2013.01); *H01S 5/3407* (2013.01)

(58) Field of Classification Search
CPC ......... H01S 5/343; H01S 5/10; H01S 5/3407; H01S 5/227
See application file for complete search history.

(56) References Cited

U.S. PATENT DOCUMENTS

| 5,822,349 | A | * | 10/1998 | Takaoka | H01S 5/227 372/46.01 |
|---|---|---|---|---|---|
| 2005/0230672 | A1 | * | 10/2005 | Kurihara | C30B 25/02 257/11 |
| 2010/0328753 | A1 | * | 12/2010 | Hayashi | B82Y 20/00 359/279 |
| 2011/0261848 | A1 | | 10/2011 | Takeuchi | |

FOREIGN PATENT DOCUMENTS

| JP | H01-309393 A | 12/1989 |
|---|---|---|
| JP | H07-111361 A | 4/1995 |
| JP | 2000-208873 A | 7/2000 |
| JP | 2005-286032 A | 10/2005 |
| JP | 4517653 B2 | 8/2010 |
| JP | 2011-249767 A | 12/2011 |
| JP | 2013-182976 A | 9/2013 |

* cited by examiner

*Primary Examiner* — Dung Nguyen
(74) *Attorney, Agent, or Firm* — Studebaker & Brackett PC

(57) ABSTRACT

An optical semiconductor device includes: a mesa stripe structure including an n-type cladding layer, an active layer, and a p-type cladding layer laid one on another; and a buried layer buried on opposite sides of the mesa stripe structure, wherein the active layer is a multiple quantum well structure having well layers and carbon-doped barrier layers, the buried layer includes a p-type semiconductor layer and an Fe-doped or Ru-doped high-resistance semiconductor layer laid one on another, side surfaces of the n-type cladding layer are covered with the p-type semiconductor layer and are not contiguous with the high-resistance semiconductor layer, and side surfaces of the active layer are not contiguous with the p-type semiconductor layer.

7 Claims, 4 Drawing Sheets

OPTICAL SEMICONDUCTOR DEVICE

BACKGROUND OF THE INVENTION

1. Field of the Invention

The present invention relates to an optical semiconductor device capable of achieving both high-speed operation and a high output.

2. Background Art

With the marked improvement in optical communication speed, uses of optical semiconductor devices with a need for high-speed operation have increased. Also, there is a demand for a direct modulation type of semiconductor laser which is a distributed feedback semiconductor laser usable even at a high temperature, directly modulated at a high speed, and designed to realize high-speed operation at a low cost. It is necessary that this direct-modulation-type semiconductor laser have a reduced element capacitance for high-speed operation and be capable of obtaining a sufficient optical output even at a high temperature. A structure using a p-type semiconductor layer and a high-resistance semiconductor layer as a buried layer has therefore been proposed (see, for example, Japanese Patent Laid-Open No. 2011-249767).

Reducing the loss of light and carriers in an active layer, i.e., a laser emission region, and a region around the active layer is effective in increasing the output. Also, increasing the relaxation vibration frequency is effective in achieving high-frequency operation. An element using a modulation-doped structure having barrier layers doped with a p-type dopant in a multiple quantum well structure has therefore been proposed (see, for example, Japanese Patent No. 4517653).

SUMMARY OF THE INVENTION

Use of a modulation-doped structure having an active layer with barrier layers to which carbon, a p-type dopant of an extremely low diffusion speed, is doped is effective in obtaining a high relaxation vibration frequency. On the other hand, there is a need to use a p-type semiconductor layer and a high-resistance semiconductor layer as a buried layer in order to achieve a low capacitance and a low leak current for high-speed operation. In a case where these layers are combined, the p-type dopant diffuses from the p-type semiconductor layer into the active layer to cause collapse of the modulation-doped structure and an increase in loss of light. Thus, it is difficult to achieve both high-speed operation and a high output. A structure in which the p-type semiconductor layer is not continuous with the active layer has also been proposed (see, for example, Japanese Patent laid-Open No. 7-111361). This structure, however, has an n-type regrown interface homojunction layer and an n-type current block layer adjacent to each other, has an increased electron leak current and is incapable of obtaining an adequate characteristic.

In view of the above-described problems, an object of the present invention is to provide an optical semiconductor device capable of achieving both high-speed operation and a high output.

According to the present invention, an optical semiconductor device includes: a mesa stripe structure including an n-type cladding layer, an active layer, and a p-type cladding layer laid one on another; and a buried layer buried on opposite sides of the mesa stripe structure, wherein the active layer is a multiple quantum well structure having well layers and carbon-doped barrier layers, the buried layer includes a p-type semiconductor layer and an Fe-doped or Ru-doped high-resistance semiconductor layer laid one on another, side surfaces of the n-type cladding layer are covered with the p-type semiconductor layer and are not contiguous with the high-resistance semiconductor layer, and side surfaces of the active layer are not contiguous with the p-type semiconductor layer.

In the present invention, the side surfaces of the n-type cladding layer are covered with the p-type semiconductor layer and are not contiguous with the high-resistance semiconductor layer. The Fermi level of the high-resistance semiconductor layer can therefore be maintained sufficiently high, so that the electron leak from the active layer to the high-resistance semiconductor layer is not increased. The side surfaces of the active layer are not contiguous with the p-type semiconductor layer. Diffusion of the p-type dopant into the active layer can thus be inhibited. A low capacitance and a high relaxation vibration frequency necessary for high-speed modulation operation can therefore be achieved as well as a high output. Therefore, both high-speed operation and an increased output can thus be achieved.

Other and further objects, features and advantages of the invention will appear more fully from the following description.

DETAILED DESCRIPTION OF THE PREFERRED EMBODIMENTS

An optical semiconductor device according to the embodiments of the present invention will be described with reference to the drawings. The same components will be denoted by the same symbols, and the repeated description thereof may be omitted.

First Embodiment

Figure 1:
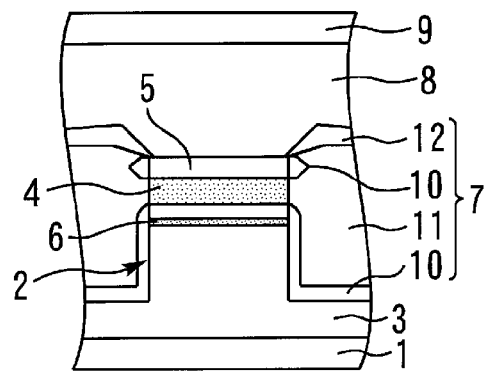
FIG. 1 is a sectional view showing a semiconductor device according to a first embodiment of the present invention.

FIG. 1 is a sectional view showing a semiconductor device according to a first embodiment of the present invention. A mesa stripe structure 2 is provided on an n-type semiconductor substrate 1. The mesa stripe structure 2 has an n-type InP cladding layer 3 (having a thickness of 100 to 2000 nm and a carrier concentration of 0.1 to $1 \times 10^{18}$ $cm^{-3}$), an active layer 4, and a p-type InP cladding layer 5 (having a thickness of 50 to 400 nm and a carrier concentration of 0.5 to $3 \times 10^{18}$ $cm^{-3}$) laid one on another. A diffraction grating 6 is provided in the n-type InP cladding layer 3. Thus, this optical semiconductor device is a distributed feedback semiconductor laser having the diffraction grating 6.

A buried layer 7 is buried on opposite sides of the mesa stripe structure 2. A p-type InP contact layer 8 (having a thickness of 100 to 3000 nm and a carrier concentration of 1 to $10 \times 10^{18}$ cm$^{-3}$) and a p-type InGaAs contact layer 9 (having a thickness of 100 to 3000 nm and a carrier concentration of 1 to $10 \times 10^{18}$ cm$^{-3}$) are successively laid on the mesa stripe structure 2 and the buried layer 7. A p-type InGaAsP layer may be formed in place of the p-type InGaAs contact layer 9.

The active layer 4 is formed of a III-V compound semiconductor (e.g., AlGaInAs) containing the Al element. The active layer 4 is a multiple quantum well structure having well layers and carbon-doped barrier layers. The buried layer 7 includes a p-type InP layer 10 (having a thickness of 50 to 600 nm and a carrier concentration of 0.1 to $1 \times 10^{18}$ cm$^{-3}$), an Fe-doped InP layer 11 (having a thickness of 1000 to 4000 nm and a carrier concentration of 0.01 to $9 \times 10^{18}$ cm$^{-3}$) and an n-type InP layer 12 (having a thickness of 50 to 1000 nm and a carrier concentration of 1 to $10 \times 10^{18}$ cm$^{-3}$) laid one on another. Side surfaces of the n-type InP cladding layer 3 are covered with and are not contiguous with the Fe-doped InP layer 11. Side surfaces of the active layer 4 are not contiguous with the p-type InP layer 10.

A manufacturing method according to the present embodiment will be described. FIGS. 2 to 5 are sectional views showing process steps of manufacturing the optical semiconductor device according to the first embodiment of the present invention.

Figure 2:
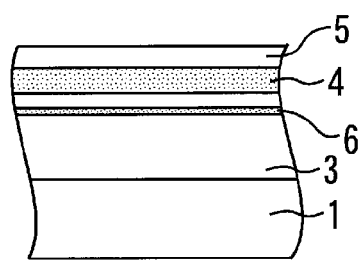
FIGS. 2 to 5 are sectional views showing process steps of manufacturing the optical semiconductor device according to the first embodiment of the present invention.

First, the n-type InP cladding layer 3, the active layer 4 and the p-type InP cladding layer 5 are successively laid on the n-type semiconductor substrate 1 with (100) surface orientation, as shown in FIG. 2. The grating of the diffraction grating 6 in the n-type InP cladding layer 3 is formed by using interference exposure, electron beam exposure or the like so that a necessary oscillation wavelength is obtained.

Figure 3:
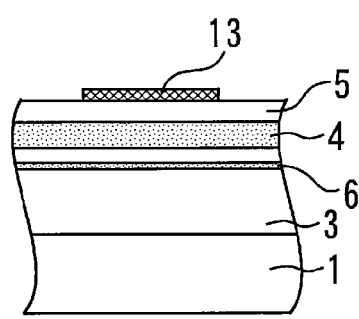
Figure 4:
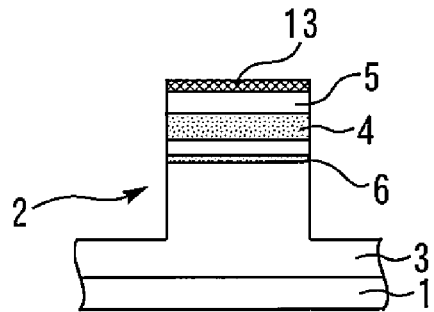

Next, a portion of this multilayer structure is covered with an insulating film mask 13 formed of SiO$_2$ for example, as shown in FIG. 3. Subsequently, the portion not covered with the insulating film mask 13 is etched to a depth of about 2 to 5 µm by dry etching or wet etching using a chemical solution. The mesa stripe structure 2 is formed thereby.

Figure 5:
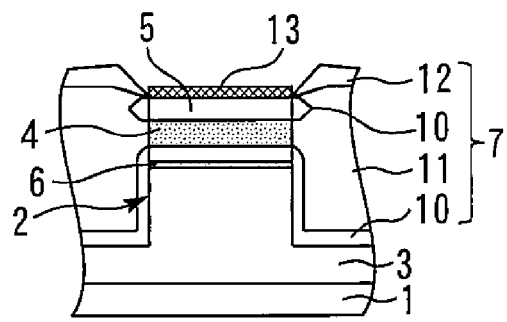

Next, as shown in FIG. 5, the p-type InP layer 10, the Fe-doped InP layer 11 and the n-type InP layer 12 are laid one on another as the buried layer 7 on the opposite sides of the mesa stripe structure 2. In the case where the active layer 4 uses a III-V compound semiconductor containing the Al element, the p-type InP layer 10 does not grow on the side surfaces of the active layer 4 because an oxide layer is formed on the side surfaces of the active layer 4. In an ordinary manufacturing process, therefore, this oxide layer is removed by adding HCl in a growth bath before the buried layer is grown. In the present embodiment, however, the p-type InP layer 10 is grown without removing the oxide layer by adding HCl. In the resulting structure, the p-type InP layer 10 does not contact the side surfaces of the active layer 4. After the oxide layer is removed by adding HCl, the Fe-doped InP layer 11 and the n-type InP layer 12 is grown.

Next, the insulating film mask 13 is removed and the p-type InP contact layer 8 and the p-type InGaAs contact layer 9 are grown, as shown in FIG. 1. Thereafter, an electrode is formed on a contact layer in a laser portion into which a current is injected, the n-type semiconductor substrate 1 is cut so as to have a suitable thickness, and an electrode is formed on the back surface of the substrate. An optical end surface is formed by using a cleavage surface of the crystal and a coating for controlling the reflectance is formed on the end surface. By cutting off device by device, the optical semiconductor device is completed.

Figure 6:
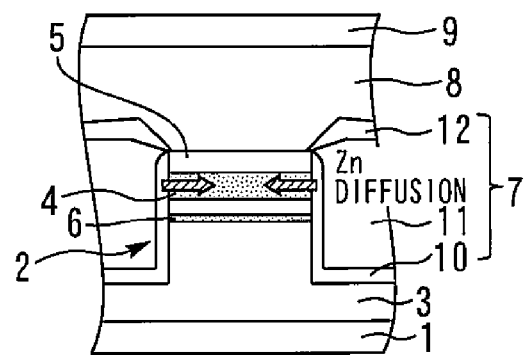
FIG. 6 is a sectional view showing a semiconductor device according to a comparative example.

The advantages of the present embodiment will be described in comparison with a comparative example. FIG. 6 is a sectional view showing a semiconductor device according to a comparative example. In the comparative example, the side surfaces of the active layer 4 contact the p-type InP layer 10 and Zn as a p-type dopant therefore diffuses from the p-type InP layer 10 into the active layer 4, thereby causing collapse of the modulation-doped structure and an increase in loss of light. On the other hand, in the present embodiment, the side surfaces of the active layer 4 are not contiguous with the p-type InP layer 10. Diffusion of the p-type dopant into the active layer 4 can thus be inhibited. A low capacitance and a high relaxation vibration frequency necessary for high-speed modulation operation can therefore be achieved as well as a high output.

Also, in the present embodiment, the side surfaces of the n-type InP cladding layer 3 are covered with the p-type InP layer 10 and are not contiguous with the Fe-doped InP layer 11. The Fermi level of the Fe-doped InP layer 11 can therefore be maintained sufficiently high, so that the electron leak from the active layer 4 to the Fe-doped InP layer 11 is not increased. Both high-speed operation and an increased output can thus be achieved in the present embodiment.

Second Embodiment

Figure 7:
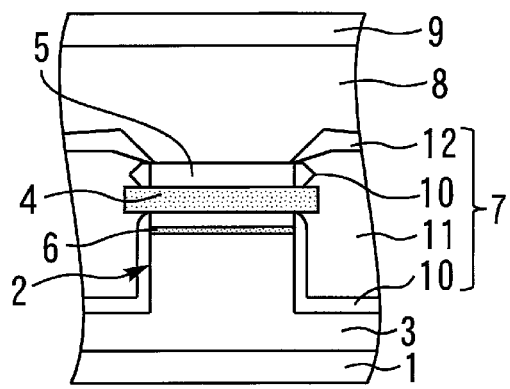
FIG. 7 is a sectional view showing a semiconductor device according to a second embodiment of the present invention.

FIG. 7 is a sectional view showing a semiconductor device according to a second embodiment of the present invention. Side surfaces of the active layer 4 project on the buried layer 7 side relative to the side surfaces of the n-type InP cladding layer 3 and the p-type InP cladding layer 5. In other respects, the structure and the advantages are the same as those of the first embodiment.

Figure 8:
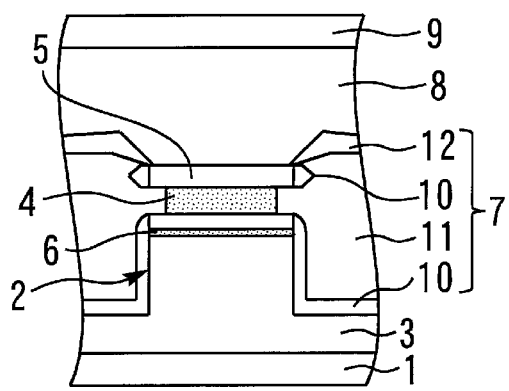
FIG. 8 is a sectional view showing a semiconductor device according to a third embodiment of the present invention.

A manufacturing method according to the present embodiment will be described. First, the n-type InP cladding layer 3, the active layer 4 and the p-type InP cladding layer 5 are successively laid on the n-type semiconductor substrate 1 with (100) surface orientation, and the mesa stripe structure 2 is formed, as in the first embodiment. Next, the side surfaces of the n-type InP cladding layer 3 and the p-type InP cladding layer 5 in the mesa stripe structure 2 are etched to a depth of about 50 to 200 nm, for example, by a treatment with a chemical solution or etching with HCl in a growth bath to form a structure such that the active layer 4 protrudes. Next, the p-type InP layer 10, the Fe-doped InP layer 11 and the n-type InP layer 12 are laid one on another as the buried layer 7 on the opposite sides of the mesa stripe structure 2. At this time, if the thickness of the p-type InP layer 10 is about 100 to 500 nm, the growth of the p-type InP layer 10 onto the side surfaces of the active layer 4 is inhibited due to the stepped state of the active layer 4, even though oxide film on the side surfaces of the active layer 4, such as that in the first embodiment, does not exist. In the resulting structure, therefore, the p-type InP layer 10 does not contact the side surfaces of the active layer 4. The subsequent steps are the same as those in the first embodiment Third Embodiment FIG. 8 is a sectional view showing a semiconductor device according to a third embodiment of the present invention. The width of the active layer 4 is smaller than the widths of the n-type InP cladding layer 3 and the p-type InP cladding layer 5. In other respects, the structure and the advantages are the same as those of the first embodiment.

A manufacturing method according to the present embodiment will be described. First, the n-type InP cladding layer 3, the active layer 4 and the p-type InP cladding layer 5 are successively laid on the n-type semiconductor substrate 1 with (100) surface orientation, and the mesa stripe structure 2 is formed, as in the first embodiment. Next, the side surfaces of the active layer 4 in the mesa stripe structure 2 are etched to a depth of about 50 to 200 nm, for example, by a treatment with a chemical solution. Next, the p-type InP layer 10, the Fe-doped InP layer 11 and the n-type InP layer 12 are laid one on another as the buried layer 7 on the opposite sides of the mesa stripe structure 2. At this time, if the thickness of the p-type InP layer 10 is about 100 to 500 nm, the growth of the p-type InP layer 10 onto the side surfaces of the active layer 4 is inhibited due to the stepped state of the active layer 4, even though oxide film on the side surfaces of the active layer 4, such as that in the first embodiment, does not exist. In the resulting structure, therefore, the p-type InP layer 10 does not contact the side surfaces of the active layer 4. The subsequent steps are the same as those in the first embodiment.

Fourth Embodiment

Figure 9:
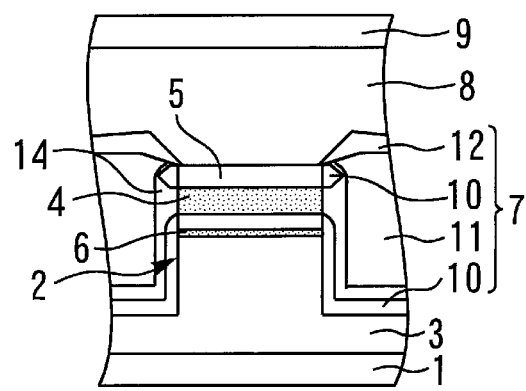
FIG. 9 is a sectional view showing a semiconductor device according to a fourth embodiment of the present invention.

FIG. 9 is a sectional view showing a semiconductor device according to a fourth embodiment of the present invention. The difference from the first embodiment resides in that a low-carrier-concentration InP layer 14 having a p-type carrier concentration lower than $1 \times 10^{17}$ cm$^{-3}$ is provided on the side surfaces of the p-type InP layer 10 and the active layer 4. The low-carrier-concentration InP layer 14 is an InP layer of a p-type carrier concentration lower than $1 \times 10^{17}$ cm$^{-3}$. Therefore, substantially no part of Zn as a p-type dopant in the low-carrier-concentration InP layer 14 diffuses into the active layer 4. There is, therefore, no possibility of the modulation-doped structure being collapsed, and the influence on the loss of light for example can be inhibited. In particular, if the barrier layers in the multiple quantum well structure have wide bandgaps, and if electrons overflow from the multiple quantum well part to the buried layer side, control on this can be achieved. In other respects, the structure and the advantages are the same as those of the first embodiment.

A manufacturing method according to the present embodiment will be described. First, the n-type InP cladding layer 3, the active layer 4 and the p-type InP cladding layer 5 are successively laid on the n-type semiconductor substrate 1 with (100) surface orientation, and the mesa stripe structure 2 is formed, as in the first embodiment. Then, the P-type InP layer 10 is grown as the buried layer 7 on the opposite sides of the mesa stripe structure 2. In the case where the active layer 4 uses a III-V compound semiconductor containing the Al element, the p-type InP layer 10 does not grow on the side surfaces of the active layer 4 because an oxide layer is formed on the side surfaces of the active layer 4. In an ordinary manufacturing process, therefore, this oxide layer is removed by adding HCl in a growth bath before the buried layer is grown. In the present embodiment, however, the p-type InP layer 10 is grown without removing the oxide layer by adding HCl. In the resulting structure, the p-type InP layer 10 does not contact the side surfaces of the active layer 4. After the oxide layer is removed by adding HCl, the low-carrier-concentration InP layer 14 having a p-type carrier concentration lower than $1 \times 10^{17}$ cm$^{-3}$ is formed on the side surfaces of the p-type InP layer 10 and the active layer 4. The Fe-doped InP layer 11 and the n-type InP layer 12 are successively laid, as in the first embodiment. The subsequent steps are the same as those in the first embodiment.

Fifth Embodiment

Figure 10:
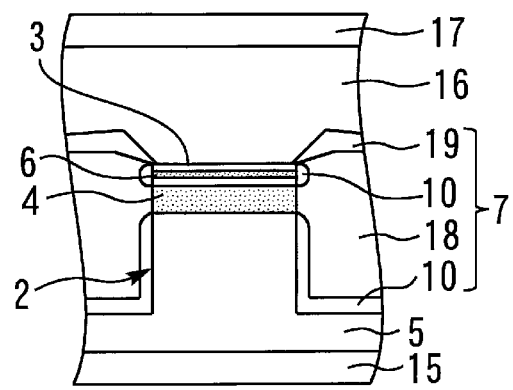
FIG. 10 is a sectional view showing a semiconductor device according to a fifth embodiment of the present invention.

FIG. 10 is a sectional view showing a semiconductor device according to a fifth embodiment of the present invention. The mesa stripe structure 2 is provided on a p-type semiconductor substrate 15. The mesa stripe structure 2 has a p-type InP cladding layer 5 (having a thickness of 100 to 2000 nm and a carrier concentration of 0.5 to $3 \times 10^{18}$ cm$^{-3}$), an active layer 4, and an n-type InP cladding layer 3 (having a thickness of 50 to 1000 nm and a carrier concentration of 0.5 to $1 \times 10^{18}$ cm$^{-3}$) laid one on another. A diffraction grating 6 is provided in the n-type InP cladding layer 3. Thus, this optical semiconductor device is a distributed feedback semiconductor laser having the diffraction grating 6.

A buried layer 7 is buried on opposite sides of the mesa stripe structure 2. An n-type InP contact layer 16 (having a thickness of 100 to 3000 nm and a carrier concentration of 1 to $10 \times 10^{18}$ cm$^{-3}$) and an n-type InGaAs contact layer 17 (having a thickness of 100 to 3000 nm and a carrier concentration of 1 to $10 \times 10^{18}$ cm$^{-3}$) are successively laid on the mesa stripe structure 2 and the buried layer 7. An n-type InGaAsP layer may be formed in place of the n-type InGaAs contact layer 17.

The active layer 4 is formed of a III-V compound semiconductor (e.g., AlGaInAs) containing the Al element. The active layer 4 is a multiple quantum well structure having well layers and carbon-doped barrier layers. The buried layer 7 includes a p-type InP layer 10 (having a thickness of 50 to 600 nm and a carrier concentration of 0.1 to $1 \times 10^{18}$ cm$^{-3}$), an Ru-doped InP layer 18 (having a thickness of 1000 to 4000 nm and a carrier concentration of 0.01 to $9 \times 10^{18}$ cm$^{-3}$) and a p-type InP layer 19 (having a thickness of 100 to 2000 nm and a carrier concentration of 1 to $10 \times 10^{18}$ cm$^{-3}$).

Side surfaces of the n-type InP cladding layer 3 are covered with the p-type InP layer 10 and are not contiguous with the Ru-doped InP layer 18. Side surfaces of the active layer 4 are not contiguous with the p-type InP layer 10. Both high-speed operation and an increased output can thus be achieved, as in the first embodiment. A low-carrier-concentration InP layer having a p-type carrier concentration lower than $1 \times 10^{17}$ cm$^{-3}$ may be inserted between the side surfaces of the p-type InP layer 10 and the active layer 4 and the Ru-doped layer, as in the fourth embodiment.

A manufacturing method according to the present embodiment will be described. First, the p-type InP cladding layer 5, the active layer 4 and the n-type InP cladding layer 3 are successively laid on the p-type semiconductor substrate 15 with (100) surface orientation. The grating of the diffraction grating 6 in the n-type InP cladding layer 3 is formed by using interference exposure, electron beam exposure or the like so that a necessary oscillation wavelength is obtained.

Next, a portion of this multilayer structure is covered with an insulating film mask formed of $SiO_2$ for example. Subsequently, the portion not covered with the insulating film mask is etched to a depth of about 2 to 5 μm by dry etching or wet etching using a chemical solution. The mesa stripe structure 2 is formed thereby.

Next, the p-type InP layer 10, the Ru-doped InP layer 18 and the p-type InP layer 19 are laid one on another as the buried layer 7 on the opposite sides of the mesa stripe structure 2. The p-type InP layer 10 is grown without removing an oxide layer on the side surfaces of the active layer 4 by adding HCl, as in the first embodiment. In the resulting structure, the p-type InP layer 10 does not contact the side surfaces of the active layer 4. After the oxide layer is removed by adding HCl, the Ru-doped InP layer 18 and the n-type InP layer 12 is grown.

Next, the insulating film mask 13 is removed and the n-type InP contact layer 16 and the n-type InGaAs contact layer 17 are grown. Thereafter, an electrode is formed on a contact layer in a laser portion into which a current is injected, the p-type semiconductor substrate 15 is cut so as to have a suitable thickness, and an electrode is formed on the back surface of the substrate. An optical end surface is formed by using a cleavage surface of the crystal and a coating for controlling the reflectance is formed on the end surface. By cutting off device by device, the optical semiconductor device is completed.

Sixth Embodiment

Figure 11:
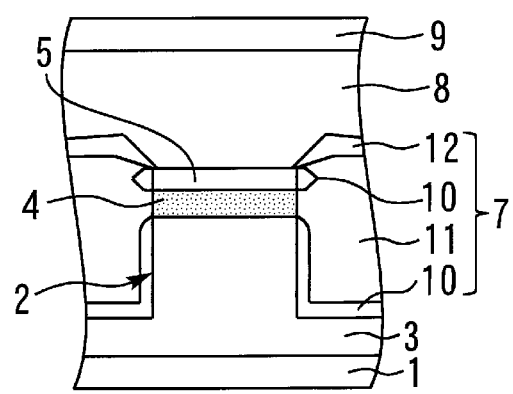
FIG. 11 is a sectional view showing a semiconductor device according to a sixth embodiment of the present invention.

FIG. 11 is a sectional view showing a semiconductor device according to a sixth embodiment of the present invention. The diffraction grating 6 is not provided. In other respects, the structure is the same as that in the first embodiment. A manufacturing method according to the present embodiment is a method defined by removing the step of forming the diffraction grating 6 in the first embodiment. This optical semiconductor device is a Fabry-Perot type semiconductor laser not having the diffraction grating 6. Also in this case, the same advantages as those of the first embodiment can be obtained.

In the first to sixth embodiments, the thickness, carrier concentration and material of each layer, etc., are not necessarily limited to the above-described examples. For example, an AlInAs layer or an AlGaInAs layer may be provided as an optical confinement layer between the n-type InP cladding layer 3 and the active layer 4 and between the active layer 4 and the p-type InP cladding layer 5. Also, a low-carrier-concentration InP layer (having a thickness of about 10 to 200 nm) in which the carrier concentration is adjusted so as not to increase the resistance may be disposed between the p-type InP cladding layer 5 and the active layer 4. Other various modifications may be made as long as the advantages of the present invention are ensured.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-152780, filed on Jul. 28, 2014 including specification, claims, drawings and summary, on which the Convention priority of the present application is based, is incorporated herein by reference in its entirety.

What is claimed is:

1. An optical semiconductor device comprising:
a mesa stripe structure including an n-type cladding layer, an active layer, and a p-type cladding layer laid one on another; and
a buried layer buried on opposite sides of the mesa stripe structure,
wherein the active layer is a multiple quantum well structure having well layers and carbon-doped barrier layers,
the buried layer includes a p-type semiconductor layer and an Fe-doped or Ru-doped high-resistance semiconductor layer laid one on another,
side surfaces of the n-type cladding layer are covered with the p-type semiconductor layer and are not contiguous with the high-resistance semiconductor layer, and
side surfaces of the active layer are not contiguous with the p-type semiconductor layer.

2. The optical semiconductor device according to claim 1, wherein the side surfaces of the active layer project on the buried layer side relative to the side surfaces of the n-type cladding layer and the p-type cladding layer.

3. The optical semiconductor device according to claim 1, wherein a width of the active layer is smaller than widths of the n-type cladding layer and the p-type cladding layer.

4. The optical semiconductor device according to claim 1, further comprising a low-carrier-concentration layer having a p-type carrier concentration lower than $1 \times 10^{17}$ cm$^{-3}$ and provided on the side surfaces of the active layer and between the p-type semiconductor layer and the high-resistance semiconductor layer.

5. The optical semiconductor device according to claim 1, wherein the optical semiconductor device is a distributed feedback semiconductor laser having a diffraction grating.

6. The optical semiconductor device according to claim 1, wherein the optical semiconductor device is a Fabry-Perot type semiconductor laser not having a diffraction grating.

7. The optical semiconductor device according to claim 1, wherein the n-type cladding layer, the active layer, and the p-type cladding layer are laid one on another from an n-type semiconductor substrate or the p-type cladding layer, the active layer, and the n-type cladding layer are laid one on another from a p-type semiconductor substrate.

* * * * *